(12) United States Patent
Baldwin, Jr.

(10) Patent No.: US 7,254,025 B2
(45) Date of Patent: Aug. 7, 2007

(54) COOLING MECHANISMS ASSOCIATED WITH CARD ADAPTER

(75) Inventor: Richard G. Baldwin, Jr., Austin, TX (US)

(73) Assignee: National Instruments Corporation, Austin, TX (US)

( * ) Notice: Subject to any disclaimer, the term of this patent is extended or adjusted under 35 U.S.C. 154(b) by 243 days.

(21) Appl. No.: 11/075,459

(22) Filed: Mar. 9, 2005

(65) Prior Publication Data

US 2006/0171119 A1    Aug. 3, 2006

Related U.S. Application Data

(60) Provisional application No. 60/649,190, filed on Feb. 2, 2005.

(51) Int. Cl.
*H05K 7/20* (2006.01)
(52) U.S. Cl. ............... 361/700; 361/688; 361/689; 361/699; 361/715; 361/716
(58) Field of Classification Search ............ None
See application file for complete search history.

(56) References Cited

U.S. PATENT DOCUMENTS 5,493,473 A * 2/1996 Yanagi .................. 361/695
5,784,263 A * 7/1998 Nelson .................. 361/785
5,818,696 A * 10/1998 Knoop .................. 361/730
6,075,704 A * 6/2000 Amberg et al. ........... 361/736
6,122,176 A * 9/2000 Clements ............... 361/752
6,128,187 A   10/2000 Mimlitch, III et al.
6,195,262 B1  2/2001 Bodette et al.

(Continued)

OTHER PUBLICATIONS

Stephen Montgomery and Will Berry; "High-density Architecture Meets Electrical and Thermal Challenges"; Intel Developer Update Magazine; Mar. 2002; 8 pages; Printed from the Internet (www.intel.com/technology/magazine/communications/sv03022.pdf).

(Continued)

*Primary Examiner*—Boris Chervinsky
(74) *Attorney, Agent, or Firm*—Meyertons Hood Kivlin Kowert & Goetzel, P.C.; Jeffrey C. Hood; Mark K. Brightwell

(57) ABSTRACT

A structure may be coupled to an adapter coupling two or more modules together. In some embodiments, the structure may direct air and/or dissipate heat from the modules into the air. The structures may direct air to components on a module that might receive less airflow without the structures. In some embodiments, the structure may be coupled to the adapter through a fastener (e.g., multiple structures may be manufactured with a plate, and the plate may be coupled to the adapter). In some embodiments, thermally conductive pathways may be used on the modules to conduct heat from components on the modules to a heat dissipating structure on the adapter.

26 Claims, 7 Drawing Sheets

U.S. PATENT DOCUMENTS

| | | |
|---|---|---|
| 6,198,633 B1 | 3/2001 | Lehman et al. |
| 6,212,075 B1 * | 4/2001 | Habing et al. ............... 361/719 |
| 6,381,147 B1 * | 4/2002 | Hayward et al. ........... 361/756 |
| 6,449,150 B1 * | 9/2002 | Boone ........................ 361/694 |
| 6,580,616 B2 * | 6/2003 | Greenside et al. .......... 361/752 |
| 6,608,755 B2 | 8/2003 | Baldwin et al. |
| 6,693,797 B2 | 2/2004 | Faneuf et al. |
| 6,700,785 B2 | 3/2004 | Berry et al. |
| 6,744,633 B1 * | 6/2004 | Dials et al. ................. 361/752 |
| 6,776,221 B2 | 8/2004 | Montgomery et al. |
| 6,922,337 B2 * | 7/2005 | Malone et al. .............. 361/695 |

OTHER PUBLICATIONS

Scott D. Garner; "Heat Pipes for Electronics Cooling Applications"; 10 pages; Printed from the Internet (www.electronics-cooling.com/Resources/EC_Articles/SEP96/sep96)02.htm).

"PCB Front Panels & Injector/Extractor Handles . . . Perfect Handling"; Rittal Product Sheet; date unknown; 10 pages.

* cited by examiner

COOLING MECHANISMS ASSOCIATED WITH CARD ADAPTER

This application claims the benefit of priority to U.S. Provisional Application No. 60/649,190, filed on Feb. 2, 2005, entitled "Cooling Mechanisms Associated with Card Adapter", invented by Richard G. Baldwin, Jr.

BACKGROUND OF THE INVENTION

1. Field of the Invention

The present invention relates generally to mechanisms for cooling electronic circuit boards, and specifically, to cooling mechanisms that rely on an adapter which couples two circuit boards.

2. Description of the Related Art

Instruments for collecting data or information from an environment or unit under test may be coupled to and controlled by computer systems. Data collected by these instruments may be used to control units being tested (e.g., an overheated unit may be shutdown) or an environment (e.g., ventilation systems may be activated if a certain chemical is detected in the air). Data may also be displayed to a user for control and/or experimental purposes (e.g., to better design the unit being tested). Instruments and/or computer systems may also perform various data analysis and data processing on acquired data prior to controlling the unit and/or displaying the data to the user. Examples of various types of instruments include oscilloscopes, digital multimeters, pressure sensors, etc., and the types of information that might be collected by respective instruments include voltage, resistance, distance, velocity, pressure, frequency of oscillation, humidity or temperature, among others.

Instrumentation systems may run on a platform such as PXI (Peripheral Component Interconnect (PCI) eXtensions for Instrumentation). PXI may combine a high-speed PCI bus with integrated timing and triggering designed for measurement and automation applications to deliver performance improvements over other architectures. PXI may be built on a modular and scalable CompactPCI specification and the high-speed PCI bus architecture. As a result, PXI products may maintain interoperability with CompactPCI, offering increased mechanical integrity, easier systems integration, and more expansion slots than desktop computers. However, due to the compact design of these modules, parts of the module may not be cooled efficiently. Excessive heat can result in shorter component lives and/or unexpected failures.

FIG. 1: Exemplary Chassis

FIG. 1 illustrates an exemplary chassis 100 conforming to any one of the following standards: VXI (Virtual Machine Environment (VME) eXtensions for Instrumentation), VME, CompactPCI, and PXI. The chassis 100 includes a housing that is configured to define a plurality of slots. The housing includes a backplane (not shown) adapted for the transmission of electrical signals. Cards 102A, 102B, and 102C are designed to physically couple to the chassis backplane. Cards 102A, 102B, and 102C may be of either 3 U or 6 U size, as is described below with reference to FIG. 2.

FIG. 2: Various Card Formats

FIG. 2A illustrates different card formats as defined by the IEEE 1101.1, CompactPCI, PXI, and similar specifications. The IEEE 1101.1, CompactPCI, PXI, and similar specifications describe two card sizes, referred to as 3 U and 6 U, and two chassis sizes (also referred to as 3 U and 6 U) designed to accept 3 U and 6 U cards, respectively. The IEEE 1101.1, CompactPCI, PXI, and similar specifications describe the 6 U card size to be more than twice as tall as the 3 U card size.

The increased size and other factors of the 6U card may create cooling problems for various components on the card. Cooling problems may especially be encountered for cards that are coupled together using an adapter. For example, two 3 U cards may be connected by an adapter to form a combined structure as suggested by FIG. 2B. Adapter 250 includes plates 250A and 250B. A region along the upper edge of card 200A and a region along the lower edge of card 200B may be clamped between plates 250A and 250B as the plates are screwed together using coupling elements 240A and 240B. The combined structure may be inserted in a slot of a 6 U chassis.

The ambient air surrounding the combined structure is heated by the electronic components of the combined structure. This heating induces a generally upward flow of the ambient air. Because the upper 3 U card of the combined structure receives air that is already partially heated by the lower 3 U card, electronic components of the upper 3 U card may have more difficulty liberating heat into the ambient air stream and thus are more prone to overheating.

For more information regarding mechanisms for coupling two electronic cards into a combined structure using adapters, please refer to the Description of the Related Art, the Summary, the Detailed Description and the Figures of:

U.S. Pat. No. 6,608,755, entitled "ADAPTER WHICH IS ADAPTED TO RECEIVE CARDS DESIGNED FOR A DIFFERENT FORM FACTOR", filed on Feb. 27, 2002, invented by Richard Baldwin, Seth Cunningham, and Alvin Becker.

SUMMARY OF THE INVENTION

An adapter is configured for coupling two or more circuit modules together. The circuit modules may be printed circuit boards or cards. In various embodiments, a set of structures may be coupled (directly or indirectly) to the adapter.

In some embodiments, the structures may be configured to direct (or deflect) air to various components on the modules and/or to dissipate heat from the modules into the air. In one embodiment, the structures are shaped like turning vanes. The air may be directed to components on the modules that might receive less airflow if the structures were not present.

In some embodiments, the structures may be used to dissipate heat from the modules into the air. The structures may be made of thermally conductive materials such as metals (e.g., copper or aluminum) or metal alloys (e.g., steel).

In one embodiment, the structures may be manufactured as part of the adapter. In another embodiment, the structures may be manufactured as part of a separate unit. The unit (e.g., a base plate of the unit) may be configured for coupling to the adapter.

In various embodiments, thermally conductive pathways, made of a heat conductive material, may be used in or on the modules to conduct heat from components (e.g., high temperature components) on the modules to the adapter. Heat may then be dissipated through the structures coupled to the adapter. The thermally conductive pathways may be used with or without the structures that direct airflow and dissipate heat. The thermally conductive pathways may be comprised in, on, or above the circuit modules, or may be applied to the surfaces of the circuit modules. For example, plated copper may be applied in a path from a high temperature component to an edge of the circuit module that makes contact with the adapter.

In some embodiments, an adapter may include a first plate, a second plate and a means for coupling the first plate to the second plate. At least one of the plates, say the first plate for the sake of discussion, includes one or more heat pipes. The one or more heat pipes are configured for coupling to a cooling system. The one or more heat pipes are configured to absorb heat from the first plate and to deliver the heat to the cooling system. The cooling system may include a system of thermally conductive plates that couple directly or indirectly to the heat pipes.

In another set of embodiments, at least one of the plates, say the first plate, includes a cooling channel having an input port for the entrance of a fluid coolant and an output port for the exit of the fluid coolant. The fluid coolant picks up heat from the first plate as it moves through the cooling channel. The heated coolant exits the cooling channel and it delivered to a cooling unit.

BRIEF DESCRIPTION OF THE DRAWINGS

A better understanding of the present invention may be obtained when the following detailed description is considered in conjunction with the following drawings, in which.

Figure 1:
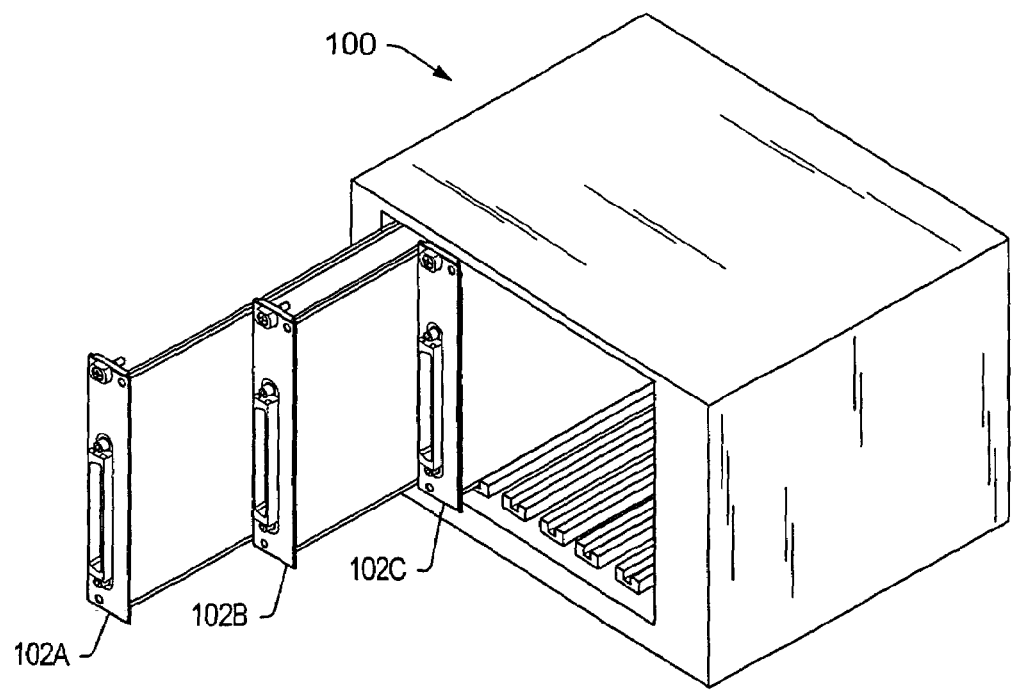
FIG. 1 illustrates an exemplary prior art chassis of either VXI, VME, CompactPCI, or PXI type.
Figure 2A:
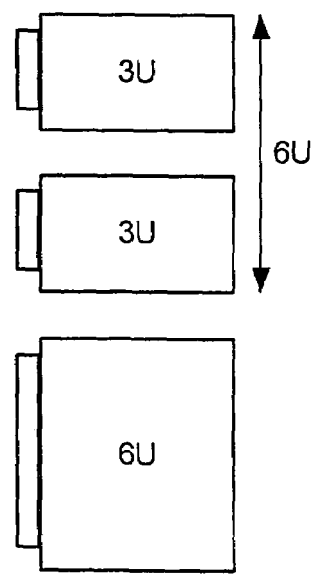
FIG. 2A illustrates different prior art card formats as defined by the IEEE 1101.1, CompactPCI, PXI, and similar specifications.
Figure 2B:
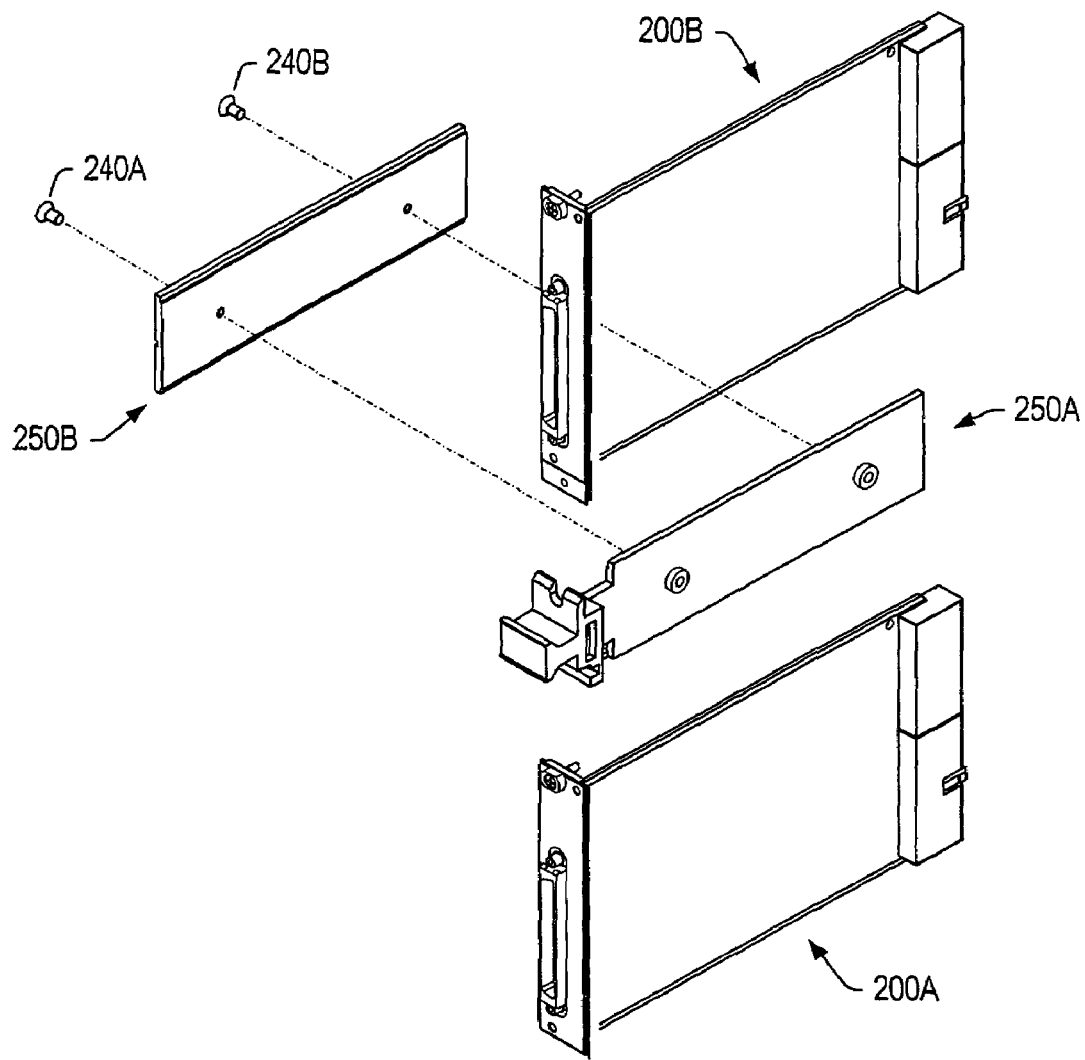
FIG. 2B illustrates an adapter configured to couple two circuit modules 200A and 200B.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as described by the appended claims. As used herein, the term "connected" means "directly or indirectly connected", and the term "coupled" means "directly or indirectly connected".

DETAILED DESCRIPTION OF THE INVENTION

Please refer to U.S. Pat. No. 6,608,755, entitled "ADAPTER WHICH IS ADAPTED TO RECEIVE CARDS DESIGNED FOR A DIFFERENT FORM FACTOR", filed on Feb. 27, 2002, invented by Richard Baldwin, Seth Cunningham, and Alvin Becker, which is hereby incorporated by reference in its entirety as though fully and completely set forth herein.

Figure 3A:
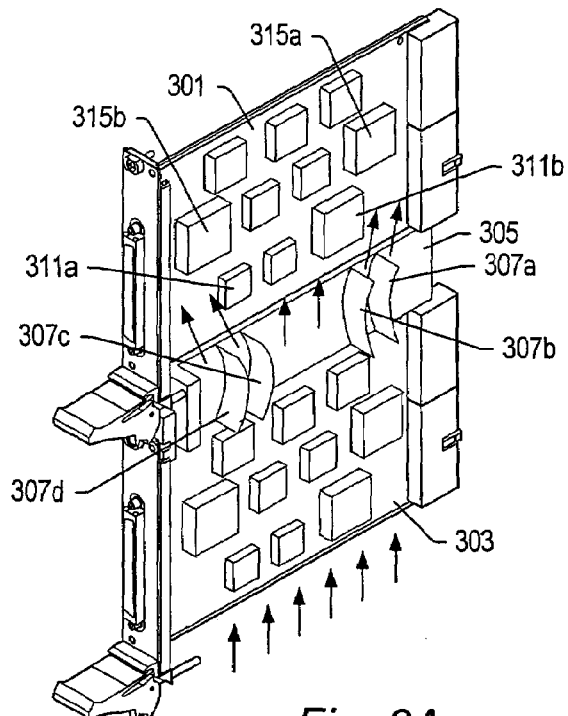
FIG. 3A illustrates curved structures coupled to an adapter, according to one embodiment.

FIG. 3A illustrates structures 307 coupled to an adapter 305, according to one set of embodiments. A first module 301 (i.e., a card) may be coupled to a second module 303 through the adapter 305. The structures 307 may serve to direct the ambient air as it flows past the adapter. The orientations and shapes of the structures 307 may be chosen to achieve a desired pattern of airflow (i.e., to direct the ambient air in certain desired directions). The structures 307 (or some subset of the structures) may be flat and tilted away from the vertical at angles that direct the ambient air in desired directions. Alternatively, the structures (or some subset of the structures) may be curved. For example, the structures may be arcuate, i.e., have shapes conforming to arcs of circles. Other curved shapes are contemplated as well. For example, the structures may have shapes governs by any desired set of polynomial expressions.

In some embodiments, the structures 307 may be configured to direct more air to certain components or areas of a module. For example, observe that components 311 partially block the delivery of air to other components (or parts of components) such as components 315. Thus, the structures 307 may be configured to direct more of the airflow towards components 315. Components 315 may be high temperature components (e.g., processors), or may be components that may operate more efficiently with more airflow for cooling. There are many possible reasons for which certain components or certain areas of a module may need additional cooling.

The airflow moving past the structures 307 may be the natural upward airflow induced by the heating of the ambient air by the electronic devices of the modules. In some embodiments, the airflow may be forced (e.g., by fans). Furthermore, the general direction of flow need not be upward. In one alternative embodiment, the air is forced to flow downward.

Any of a wide variety of airflow patterns may be achieved by appropriate choice of the shapes for the structures 307. For example, the structures may be shaped to direct more air toward higher temperature components. As another example, the structures may be shaped to direct more air towards components that would not otherwise receive enough air (e.g., components located on the top of the first module 301).

Figure 3B:
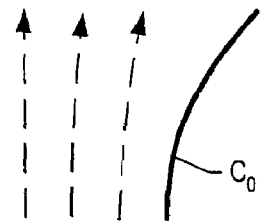
FIG. 3B illustrates the phenomenon of flow separation from a single curved structure.
Figure 3C:
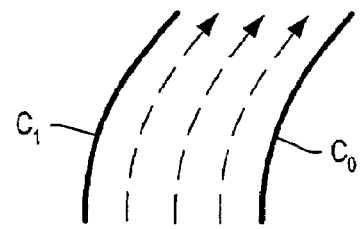
FIG. 3C illustrates less separation of flow for the air between two adjacent curved structures.

While four structures 307 are shown in FIG. 3A, in various other embodiments, other numbers of structures 307 may be used. In fact, a configuration with a larger number of structures may be more effective at preventing flow separation from the structures, and thus, may achieve better directivity of the air in the desired output directions. As suggested in FIG. 3B, the air flowing over the convex side of a single isolated curved structure $C_0$ has a tendency to separate from the surface. The dotted arrows are streamlines of the airflow. If a second structure $C_1$ (e.g., a structure with similar curvature) is placed at not too great a distance from curved structure $C_0$ on the convex side of the curved structure $C_0$ as suggested in FIG. 3C, the airflow between the two structures has more of a tendency to follow a path conforming to the shape of the curved structures. Thus, in some embodiments, the number of the structures 307 may be greater than four to create a denser spacing the structures, and thus, to decrease airflow separation from the structures.

While it may be desirable to maximize the surface area of a structure in order to deflect a greater volume of air, the structure's height in the direction perpendicular to the plane of the modules) may be limited to avoid contact with other neighboring modules or adapters when the first module/second module assembly is inserted into a chassis.

FIG. 3A illustrates the structures 307 as being straight in the direction perpendicular to the plane of the modules. However, other embodiments are contemplated where the structures 307 are curved in this direction.

In some embodiments, in addition to directing airflow, the structures 307 may be configured to dissipate heat into the ambient air from the adapter and from the first module and/or the second module.

Figure 4:
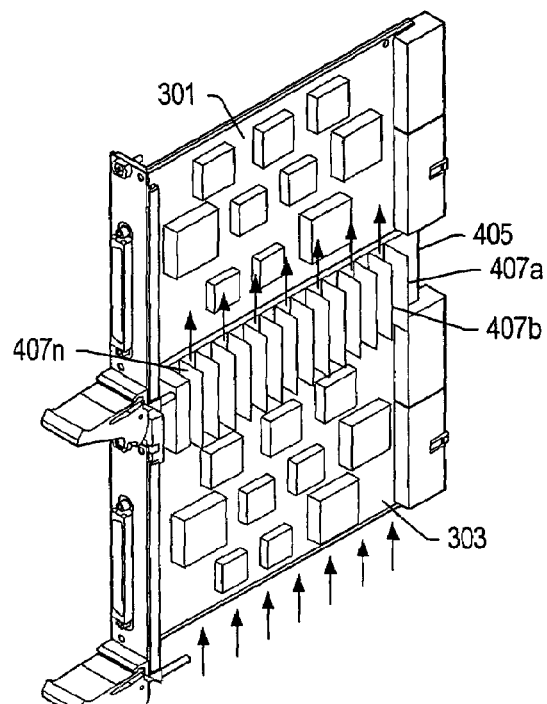
FIG. 4 illustrates heat dissipating structures coupled to an adapter, according to one embodiment.

FIG. 4 illustrates structures 407 coupled to an adapter 405, according to one set of embodiments. The adapter 405 may couple the first module 301 to the second module 303. Structures 407 may serve to dissipate heat into the air from the first module and/or second module. The structures 407 may comprise a material that is (or materials that are) effective at dissipating heat into the ambient air. For example, the structures 407 may be made of thermally conductive materials such as a metal (e.g., copper or aluminum) or a metal alloy (e.g., steel). The rate of heat dissipation from the structures 407 into the ambient air may be increased if the ambient air is moving at a higher velocity and/or is at a lower temperature.

In some embodiments, the structures 407 may also be shaped and oriented to direct the flow of ambient air in desired directions. For example, the structures 407 may be curved to more effectively direct the flow of air in the desired directions. The structures 407 may also have a limited height such that they do not contact neighboring modules or adapters when the first module/second module assembly is inserted into a chassis alongside other modules.

Figure 5:
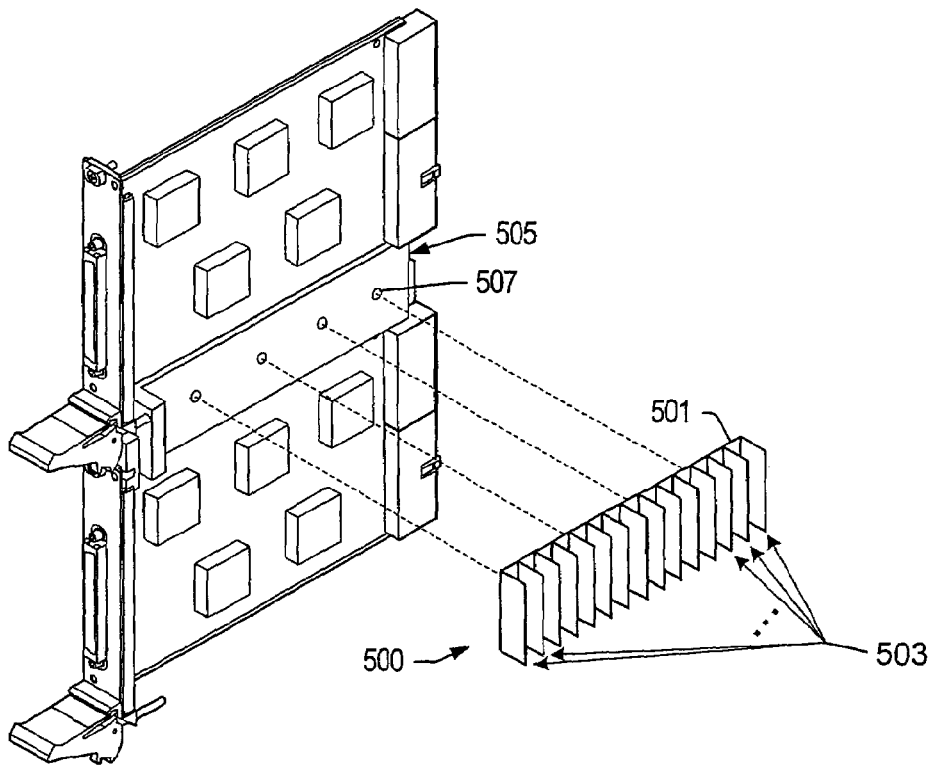
FIG. 5 illustrates one embodiment of a unit 500 including structures 503.

FIG. 5 illustrates a unit 500 configured to couple to adapter 505, to absorb heat from the adapter 505 and to dissipate the heat into the ambient air, according to one set of embodiments. The adapter 505 may itself absorb heat from the first module 301 and/or the second module 303 and conduct the heat to the unit 500.

The unit 500 may include a plate 501 and structures 503. The unit 500 may be formed as a single piece (e.g., by die-casting and/or machining). Alternatively, the plate 501 and structures 503 may be formed separately. In this case, the structures 503 may be attached to the plate 501 by any of various mechanisms. For example, the structures 503 may be welded or brazed onto the plate 501. It is preferable that the mechanism of attachment should create a physical connection having low resistance to the conduction of heat.

The plate 501 and structures 503 may be made of a thermally conductive material (or combination of materials) to effectively absorb heat from the adapter 505 and dissipate the heat into the ambient air. For example, the plate 501 and structures 503 may be made of aluminum, copper or steel.

In some embodiments, the unit 500 may be manufactured separately from the adapter 505 and then coupled to the adapter 505 in a way that offers low resistance to the conductive flow of heat. For example, fasteners such as screws or rivets may be used in conjunction with complementary holes to attach the unit 500 to the adapter 500. In one embodiment, the unit 500 has protrusions that may be snapped into holes on the adapter 505 to establish physical contact between the adapter 505 and the unit 500. (To avoid confusion in the diagram only one of the holes, i.e., hole 507, is labeled.) (Of course, as an alternative, the protrusions may be on the adapter 505 and the holes on the unit 500.)

In another embodiment, the unit 500 may be attached to the adapter 505 by some means not requiring fasteners, holes or protrusions. For example, the unit 500 and the adapter 505 may be coupled using a thermally conductive adhesive.

The shape of the structures 503 and the orientation of the structures 503 relative to the plate 501 may be chosen to encourage the efficient dissipation of heat into the ambient air when the unit 500 is coupled to the adapter 505. For example, in one embodiment, the structures 503 are oriented vertically (or approximately vertically) as suggested in FIG. 5.

While it is desirable to maximize the surface area of the structures 503 to maximize the rate of transfer of heat into the ambient air, the structures 503 may have a limited height (in the direction perpendicular to the plane of the modules) so that they do not contact neighboring modules or adapters when the first module/second module assembly is inserted into a chassis alongside other modules.

In some embodiments, the structures 503 may be shaped and oriented not only to encourage heat dissipation (into the ambient air) but also to direct the flow of the ambient air in desired directions. For example, the structures 407 may be tilted or curved to more effectively direct the flow of air in the desired directions.

Figure 6:
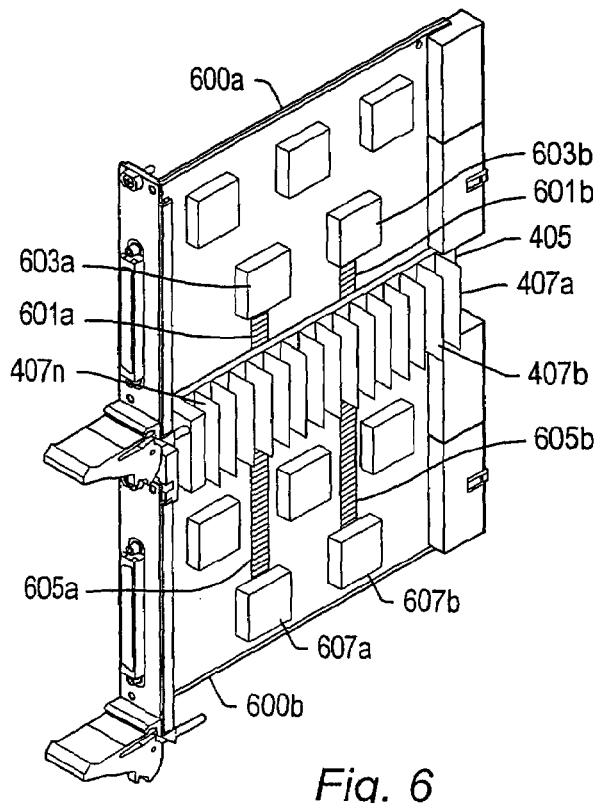
FIG. 6 illustrates thermally conductive pathways to conduct heat from heat-generating components on the modules to the adapter 405.

FIG. 6 illustrates an embodiment of modules with thermally conductive pathways that serve to conduct heat from heat-generating components such as components 603 and 605 to adapter 405 and thence to heat-dissipative structures 407a-n (collectively referred to as heat dissipative structures 407). Thermally conductive pathways 601a and 601b are shown (on the upper module 600A) conducting heat away from components 603a and 603b respectively. Similarly, thermally conductive pathways 605a and 605b are shown (on the lower module 600B) conducting heat away from components 607a and 607b.

The heat-dissipative structures 407 may be part of a unit such as unit 500 (of FIG. 5) that is configured for coupling to the adapter 405. Alternatively, the heat-dissipative structures 407 may be directly coupled to the adapter 405, or, manufactured as part of the adapter 405.

The thermally conductive pathways may be made of a thermally conductive material (or combination of materials) such as a metal or a metal alloy. For example, in one embodiment, the thermally conductive pathways are made of copper.

The thermally conductive pathways may be applied to the surface of each module. For example, in one set of embodiments, the thermally conductive pathways may be traces which are plated onto the surface of each module.

The thermally conductive pathways may conduct heat to an edge of the module that is in physical contact with the adapter 405. Thus, the thermally conductive pathways transport heat from heat-generating components (e.g., integrated circuits) on the modules 600a and 600b to the adapter 405. The adapter 405 itself conducts the heat to the heat-dissipative structures 407. The heat-dissipative structures 407 liberate the heat into the ambient air.

In some embodiments, each thermally conductive pathway may have an expanded terminal portion (e.g., terminal pad) at the edge of the module. The terminal pad allows the thermally conductive pathway to have a larger area of contact with the adapter 405, and thus, facilitates higher rates of heat transfer to the adapter.

While two thermally conductive pathways are shown on each module in FIG. 6, any number of thermally conductive pathways may be used.

While the thermally conductive pathways are illustrated as being straight in FIG. 6, more generally, the thermally conductive pathways may follow any desired paths. For example, a thermally conductive pathway may curve around components.

While each thermally conductive pathway is illustrated as being coupled to one heat-generating component, more generally, a thermally conductive pathway may couple to one or more heat-generating components.

Figure 7A:
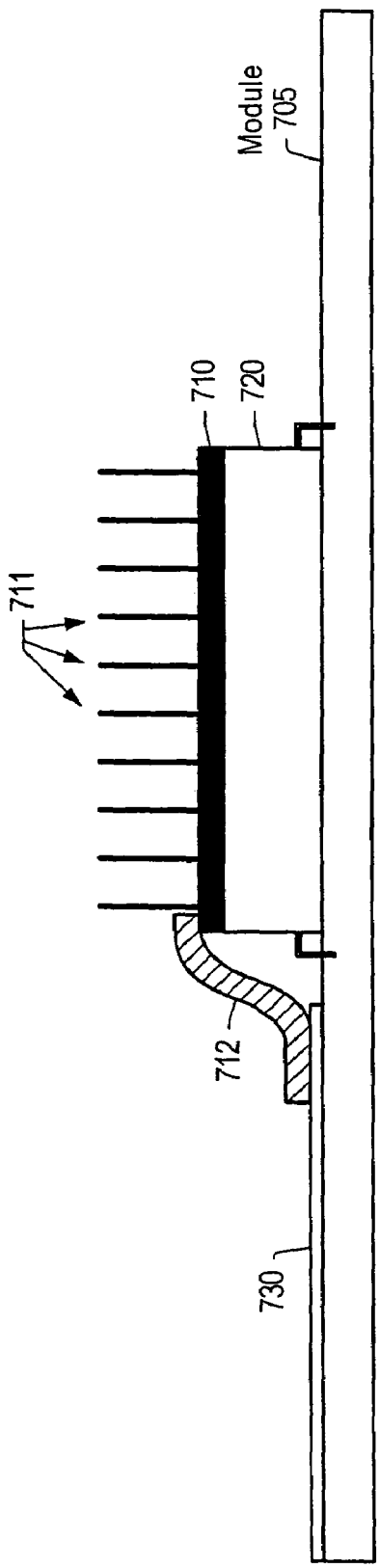
FIG. 7A illustrates one embodiment of a bridge 712 for transporting heat from a heat sink onto a thermally conductive pathway.

FIG. 7A illustrates one embodiment of a heat sink 710. The heat sink 710 is configured for mounting on a surface (e.g., a top surface) of a heat-generating component 720 which is itself mounted on a module 705 (such as module 600a or 600b). The heat sink 710 is mounted on the component 720 in manner that establishes a thermally conductive contact.

The heat sink 710 couples to a heat conductive pathway 730 (such as pathway 601a, 601b, 605a or 605b) through a thermally conductive bridge 712.

The bridge 712 makes thermally conductive contacts with the heat sink 710 and the pathway 730. Thus, the heat sink 710 absorbs heat from the component 720 and the bridge 712 conducts the heat from the heat sink to the pathway 730. The pathway 730 conducts heat to the adapter as described above.

In one embodiment, the bridge 712 is configured to be flexible. For example, the bridge 712 may be a metallic strap (e.g., a copper strap).

Any of various means are contemplated for coupling the bridge 712 to the heat sink 710 and the pathway 730. For example, a thermally conductive adhesive may be used to achieve these couplings.

In one embodiment, the heat sink 710 may include fins such as fins 711 to dissipate heat more directly into the ambient air. The fins may be metallic plates.

Figure 7B:
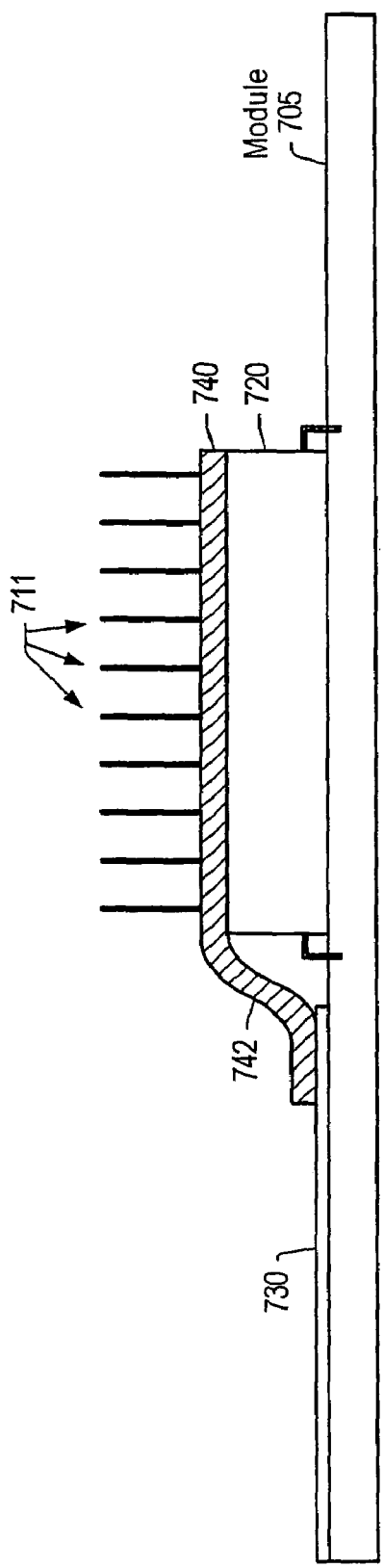
FIG. 7B illustrates one embodiment of a heat sink having a bridging structure that transports heat from the heat sink onto a thermally conductive pathway.

FIG. 7B illustrates one embodiment of a heat sink 740 that includes a bridge structure 742. A surface of the bridge structure couples to the thermally conductive pathway 730.

Figure 8:
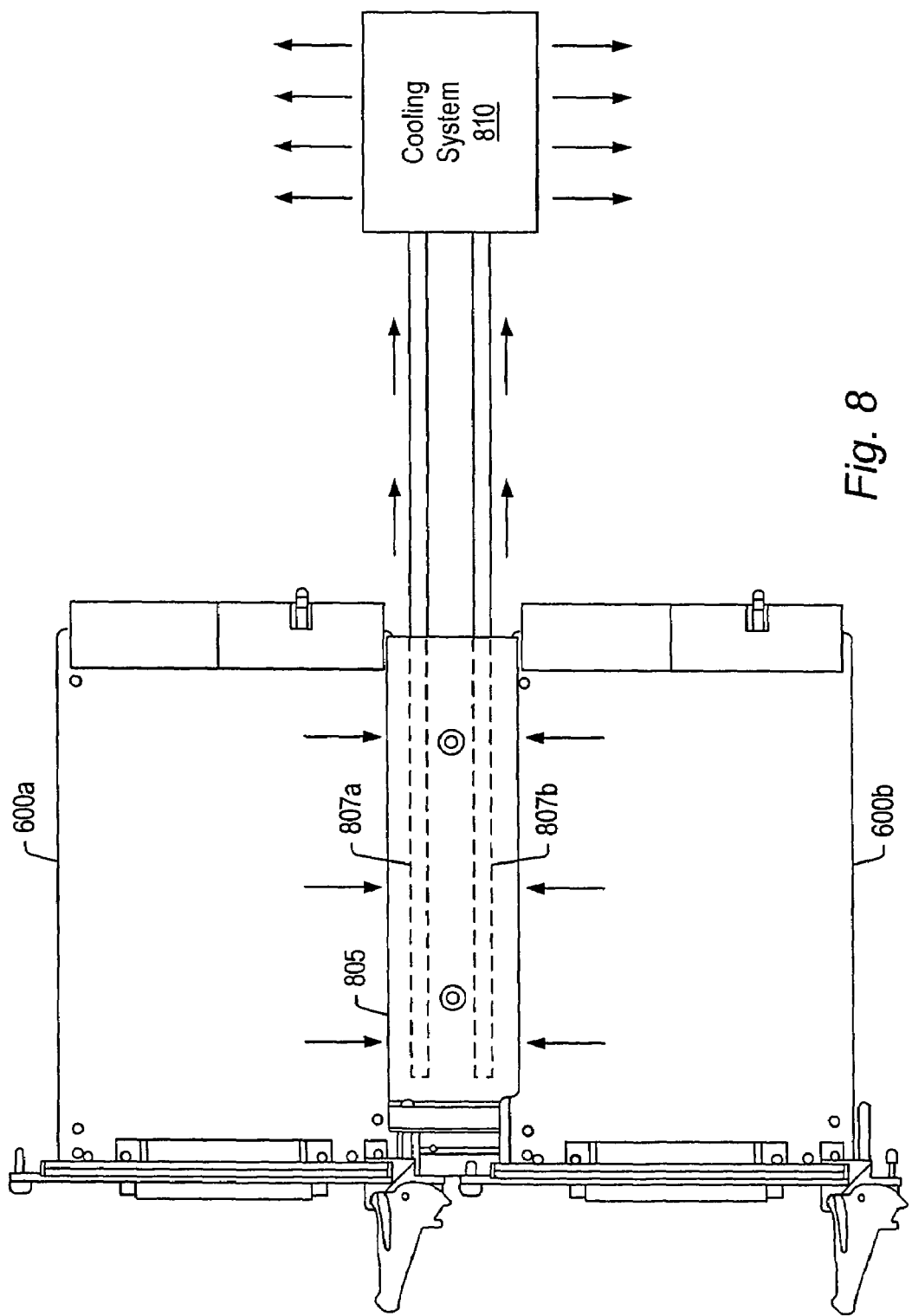
FIG. 8 illustrates one embodiment of an adapter having (e.g., in one of its plates) one or more heat pipes that conduct heat away from the adapter to a cooling unit.

In one set of embodiments, an adapter 805 may include one or more heat pipes 807 that serve to transport heat away from the adapter 805 to a cooling system 810. FIG. 8 illustrates an embodiment of adapter 805 having two heat pipes, i.e., heat pipes 807a and 807b. The heat pipes may exit out the rear of the adapter 805 as illustrated and out through the backplane of the chassis (not shown). Alternatively, the heat pipes may exit out the front of the adapter 805. In FIG. 8, the front of the adapter is on the left and the rear of the adapter is on the right.

The adapter 805 absorbs heat from the modules, and the heat pipes 807 transport the heat to the cooling system 810 as suggested by the directions of the arrows. The cooling system 810 may be a passive cooling system. For example, in one embodiment, the cooling system 810 may include a system of plates that couple to the heat pipes and dissipate heat from the heat pipes into the ambient air.

In one set of embodiments, each of heat pipes 807 has an internal cavity that is lined with a wick (having a capillary structure). The internal cavity may be evacuated of air. The wick is saturated with a working fluid. Thus, the pressure of the internal cavity is determined by the vapor pressure of the working fluid. The heat pipe absorbs heat from the adapter 805. The heat induces vaporization of the working fluid. The vaporization induces a pressure gradient in the internal cavity. The pressure gradient induces flow of vapor along the heat pipe towards the cooling system end of the heat pipe. The vapor condenses at the cooling system end of the heat pipe. The fluid condensate is absorbed by the wick. Capillary forces in the wick drive the fluid back towards the adapter 805. The heat pipe may be radically more efficient at transporting heat than solid copper pipe.

The design and configuration of heat pipes are known from technical references such as the following:

(1) Eastman, G. Yale and Ernst D. M., "Heat Transfer Technology (Heat Pipe)", Kirk-Othmer: Encyclopedia of Chemical Technology, Volume 12, John Wiley and Sons, Inc., 1980; and (2) Peterson, G. P., "An Introduction to Heat Pipes Modeling, Testing, and Applications", John Wiley and Sons, Inc., 1994.

Any of various kinds of known heat pipes may be used to realize the heat pipes 807 of adapter 805.

Figure 9:
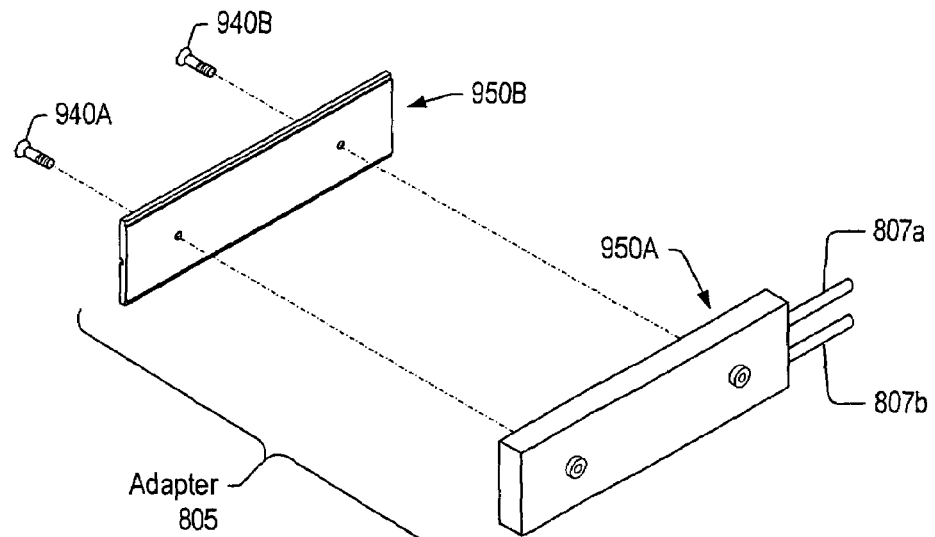
FIG. 9 illustrates one embodiment of an adapter having two plates and having heat pipes embedded in one of the plates.

In one embodiment, adapter 805 may include plates 950A and 950B as illustrated in FIG. 9. One or both of the plates may be thick enough to included embedded heat pipes 807. The plates may be made of a thermally conductive material (or materials). When the plates are screwed together (or otherwise coupled together), the plates may trap the lower edge of module 600a and the upper edge of module 600b.

Figure 10:
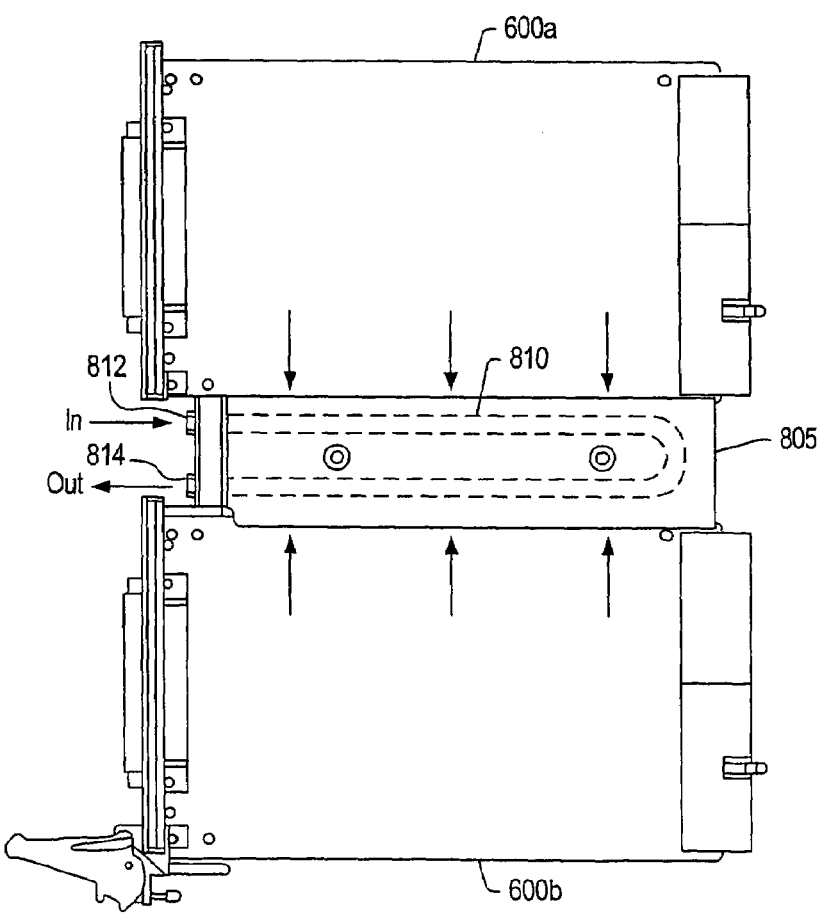
FIG. 10 illustrates one embodiment of an adapter having an embedded cooling channel for the circulation of a fluid coolant.

In one set of embodiments, the adapter 805 (i.e., one or both plates of the adapter 805) may include a liquid cooling channel 810 (i.e., embedded piping) as suggested by FIG. 10. The channel 810 may have an input port 812 and an output port 814 on the front face of the adapter 805. A liquid coolant is forced through the channel 810. The coolant enters at the input port 812 and exits at the output port 814. As it travels through the channel 810, the coolant picks up heat from the adapter 805. In one embodiment, the channel 810 is shaped like an elongated letter "U". However, other shapes are contemplated.

The heated coolant exits the output port and is delivered to a cooling unit (not shown). The cooling unit removes the heat from the coolant and expels it elsewhere (e.g., into the ambient air). The "cooled" coolant then makes a repeat trip through the channel 810, and so forth. In one embodiment, the cooling unit operates in a fashion similar to the radiator found in automobiles.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, steps in processes and procedures may admit permutation of order, and certain features of the invention may be utilized independently, all as would be apparent to one skilled in the art after having the benefit of this description of the invention. Changes may be made in the elements described herein without departing from the spirit and scope of the invention as defined in the following claims.

What is claimed is:

1. An apparatus, comprising:
a first circuit module coupled to a second circuit module by an adapter; and
a first structure coupled to the adapter, wherein the first structure is configured to facilitate a dissipation of heat from at least a portion of the first module;
wherein the first module comprises a thermally conductive pathway that conducts heat to an edge of the first module, wherein the adapter is configured to make physical contact with the thermally conductive pathway along the edge of the first module.

2. The apparatus of claim 1, wherein the first structure is configured to direct airflow in a first desired direction to facilitate a dissipation of heat from one or more components on the first module.

3. The apparatus of claim 2, further comprising a second structure coupled to the adapter, wherein the second structure is configured to direct airflow in a second desired direction different from the first desired direction.

4. The apparatus of claim 1, wherein the first structure is curved.

5. The apparatus of claim 1, wherein the first structure is configured to dissipate heat from the adapter into ambient air moving past the first structure.

6. The apparatus of claim 1, wherein the first structure is made of a thermally conductive material.

7. The apparatus of claim 1, wherein the first structure is configured to direct air towards a set of one or more components on the first module and to dissipate heat from the adapter into the air.

8. The apparatus of claim 7, further comprising at least one other structure coupled to the adapter, wherein the at least one other structure directs air toward a different set of one or more components on the first module.

9. The apparatus of claim 1, wherein the first module and the second module are each 3U modules.

10. The apparatus of claim 1, wherein the adapter couples the first module and second module to form an assembly that fits within a 6U slot of a chassis.

11. The apparatus of claim 1 further comprising a means for transporting heat from a heat sink to the thermally conductive pathway, wherein the heat sink is configured for coupling to a heat-generating component on the first module.

12. The apparatus of claim 1, wherein the adapter is configured to conduct heat from the thermally conductive pathway to the first structure, wherein the first structure is configured to dissipate the heat into the ambient air.

13. An apparatus for coupling a first module to a second module, wherein the first module and the second module each comprises:
a front face;
a back face, opposite to the front face, wherein the back face comprises one or more connectors for coupling to a chassis;
a first lateral edge, comprising a first keep-out region which extends at least a portion of the distance from the front face to the back face;
a second lateral edge opposite to the first lateral edge, comprising a second keep-out region which extends at least a portion of the distance from the front face to the back face;
wherein each of the first module and the second module has a first size; the apparatus comprising:
a first plate;
a second plate; and
one or more coupling elements operable to couple the first plate to the second plate;
a set of structures coupled to the first plate, wherein the set of structures are configured to facilitate a dissipation of heat from at least a portion of the first module;
wherein the first plate and the second plate each comprises a first lateral edge, and a second lateral edge opposite to the first lateral edge;
wherein, in coupling the first plate to the second plate, the one or more coupling elements are operable to clamp the first keep-out region of the first module between the second lateral edge of the first plate and the second lateral edge of the second plate, and to clamp the second keep-out region of the second module between the first lateral edge of the first plate and the first lateral edge of the second plate, thereby coupling the first module to the second module to form a combined module of a second size; and
wherein the combined module is operable to be inserted into a slot in the chassis, wherein the chassis comprises one or more slots each operable to receive a module of said second size;
wherein the first module comprises a thermally conductive pathway that is configured to conduct heat to an edge of the first module, wherein the first plate is configured to make physical contact with the thermally conductive pathway.

14. The apparatus of claim 13, wherein the set of structures are configured to direct airflow in a set of one or more desired directions to facilitate the dissipation of heat from one or more components on the first module.

15. The apparatus of claim 13, wherein one or more of the structures of said set of structures are curved.

16. The apparatus of claim 13, wherein the set of structures are configured to dissipate heat from the first plate into the air.

17. The apparatus of claim 13, wherein the set of structures are made of a thermally conductive material.

18. The apparatus of claim 13 further comprising a means for transporting heat from a heat sink to the thermally conductive pathway, wherein the heat sink is configured for coupling to a heat-generating component on the first module.

19. An adapter configured for coupling a first circuit module to a second module, the adapter comprising:
a first plate;
a second plate; and
a means for coupling the first plate to the second plate;
wherein the first plate includes one or more heat pipes, wherein the one or more heat pipes are configured for coupling to a cooling system, wherein the one or more heat pipes are configured to absorb heat from the first plate and to deliver the heat to the cooling system.

20. An adapter configured for coupling a first circuit module to a second module, the adapter comprising:
a first plate;
a second plate; and
a means for coupling the first plate to the second plate;
wherein the adapter includes a cooling channel having an input port for the entrance of a fluid coolant and an output port for the exit of the fluid coolant.

21. An apparatus, comprising:
a first circuit module coupled to a second circuit module by an adapter; and a first structure coupled to the adapter, wherein the first structure is configured to facilitate a dissipation of heat from at least a portion of the first module;

wherein the second module comprises a thermally conductive pathway that conducts heat to an edge of the second module, wherein the adapter is configured to make physical contact with the thermally conductive pathway of the second module along the edge of the second module.

22. The apparatus of claim 21 further comprising a means for transporting heat from a heat sink to the thermally conductive pathway, wherein the heat sink is configured for coupling to a heat-generating component on the second module.

23. An apparatus, comprising:
a first circuit module coupled to a second circuit module by an adapter;
a plate and a set of structures, wherein the set of structures are coupled to the plate, wherein the plate is configured for coupling to the adapter in a manner that establishes a thermally conductive contact, wherein at least a first structure of the set of structures is configured to facilitate a dissipation of heat from at least a portion of the first module.

24. An apparatus for coupling a first module to a second module, wherein the first module and the second module each comprises:
a front face;
a back face, opposite to the front face, wherein the back face comprises one or more connectors for coupling to a chassis;
a first lateral edge, comprising a first keep-out region which extends at least a portion of the distance from the front face to the back face;
a second lateral edge opposite to the first lateral edge, comprising a second keep-out region which extends at least a portion of the distance from the front face to the back face;
wherein each of the first module and the second module has a first size; the apparatus comprising:
a first plate;
a second plate; and
one or more coupling elements operable to couple the first plate to the second plate;
a set of structures coupled to the first plate, wherein the set of structures are configured to facilitate a dissipation of heat from at least a portion of the first module;
wherein the first plate and the second plate each comprises a first lateral edge, and
a second lateral edge opposite to the first lateral edge;
wherein, in coupling the first plate to the second plate, the one or more coupling elements are operable to clamp the first keep-out region of the first module between the second lateral edge of the first plate and the second lateral edge of the second plate, and to clamp the second keep-out region of the second module between the first lateral edge of the first plate and the first lateral edge of the second plate, thereby coupling the first module to the second module to form a combined module of a second size; and wherein the combined module is operable to be inserted into a slot in the chassis, wherein the chassis comprises one or more slots each operable to receive a module of said second size;

wherein the second module comprises a thermally conductive pathway that is configured to conduct heat to an edge of the second module, wherein the first plate is configured to make physical contact with the thermally conductive pathway of the second module.

25. The apparatus of claim 24 further comprising a means for transporting heat from a heat sink to the thermally conductive pathway, wherein the heat sink is configured for coupling to a heat-generating component on the second module.

26. An apparatus for coupling a first module to a second module, wherein the first module and the second module each comprises:
a front face;
a back face, opposite to the front face, wherein the back face comprises one or more connectors for coupling to a chassis;
a first lateral edge, comprising a first keep-out region which extends at least a portion of the distance from the front face to the back face;
a second lateral edge opposite to the first lateral edge, comprising a second keep-out region which extends at least a portion of the distance from the front face to the back face;
wherein each of the first module and the second module has a first size; the apparatus comprising:
a first plate;
a second plate; and
one or more coupling elements operable to couple the first plate to the second plate;
a third plate and a set of structures, wherein the set of structures couple to the third plate, wherein the third plate is configured for coupling to the first plate in a manner that establishes a thermally conductive contact, wherein the set of structures are configured to facilitate a dissipation of heat from at least a portion of the first module;
wherein the first plate and the second plate each comprises a first lateral edge, and a second lateral edge opposite to the first lateral edge;
wherein, in coupling the first plate to the second plate, the one or more coupling elements are operable to clamp the first keep-out region of the first module between the second lateral edge of the first plate and the second lateral edge of the second plate, and to clamp the second keep-out region of the second module between the first lateral edge of the first plate and the first lateral edge of the second plate, thereby coupling the first module to the second module to form a combined module of a second size; and
wherein the combined module is operable to be inserted into a slot in the chassis, wherein the chassis comprises one or more slots each operable to receive a module of said second size.

* * * * *